US010748737B2

(12) United States Patent
Ioakeimidi et al.

(10) Patent No.: US 10,748,737 B2
(45) Date of Patent: Aug. 18, 2020

(54) ELECTRON BEAM GENERATION AND MEASUREMENT

(71) Applicant: KLA-TENCOR CORPORATION, Milpitas, CA (US)

(72) Inventors: Katerina Ioakeimidi, San Francisco, CA (US); Gildardo R. Delgado, Livermore, CA (US); Frances Hill, Sunnyvale, CA (US); Michael E. Romero, San Jose, CA (US); Rudy F. Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/149,260

(22) Filed: Oct. 2, 2018

(65) Prior Publication Data

US 2019/0108967 A1 Apr. 11, 2019

Related U.S. Application Data

(60) Provisional application No. 62/570,438, filed on Oct. 10, 2017.

(51) Int. Cl.
*H01J 37/073* (2006.01)
*H01J 37/26* (2006.01)
*G02B 27/09* (2006.01)
*H01J 40/06* (2006.01)
*H01J 40/18* (2006.01)
*H01J 1/304* (2006.01)
*H01J 19/24* (2006.01)
*H01J 37/06* (2006.01)
(Continued)

(52) U.S. Cl.
CPC ........ *H01J 37/073* (2013.01); *G02B 27/0927* (2013.01); *H01J 1/3044* (2013.01); *H01J 19/24* (2013.01); *H01J 37/06* (2013.01); *H01J 37/26* (2013.01); *H01J 37/28* (2013.01); *H01J 40/06* (2013.01); *H01J 40/18* (2013.01); *H01J 1/34* (2013.01); *H01J 2201/308* (2013.01);
(Continued)

(58) Field of Classification Search
CPC .......... H01J 37/073; H01J 37/06; H01J 37/26; H01J 37/28; H01J 1/3044; H01J 19/24; H01J 40/06; H01J 40/18; G02B 27/0927
See application file for complete search history.

(56) References Cited

U.S. PATENT DOCUMENTS

| 5,363,021 A | 11/1994 | MacDonald |
| 7,015,467 B2 * | 3/2006 | Maldonado ............ B82Y 10/00 250/306 |

(Continued)

FOREIGN PATENT DOCUMENTS

| JP | 2012221678 A | * 11/2012 | |
| JP | 2012221678 A | 11/2012 | |
| WO | WO-2017168554 A1 | * 10/2017 | ............ H01J 37/073 |

OTHER PUBLICATIONS

ISA/KR, International Search Report and Written Opinion for PCT/US2018/054483 dated Feb. 1, 2019.
(Continued)

*Primary Examiner* — David E Smith
(74) *Attorney, Agent, or Firm* — Hodgson Russ LLP

(57) ABSTRACT

A flat top laser beam is used to generate an electron beam with a photocathode that can include an alkali halide. The flat top profile can be generated using an optical array. The laser beam can be split into multiple laser beams or beamlets, each of which can have the flat top profile. A phosphor screen can be imaged to determine space charge effects or electron energy of the electron beam.

17 Claims, 7 Drawing Sheets

(51) Int. Cl.
*H01J 37/28* (2006.01)
*H01J 1/34* (2006.01)
*H01L 21/67* (2006.01)

(52) U.S. Cl.
CPC ............ *H01J 2201/3048* (2013.01); *H01J 2201/30411* (2013.01); *H01J 2201/30449* (2013.01); *H01J 2201/3423* (2013.01); *H01J 2201/3425* (2013.01); *H01J 2201/3426* (2013.01); *H01J 2237/06333* (2013.01); *H01J 2237/24521* (2013.01); *H01J 2237/24592* (2013.01); *H01J 2237/2817* (2013.01); *H01L 21/67288* (2013.01)

(56) References Cited

U.S. PATENT DOCUMENTS

| | | | |
|---|---|---|---|
| 8,063,365 | B1 | 11/2011 | Standiford et al. |
| 2002/0166963 | A1* | 11/2002 | Kondo ............... H01J 37/28 |
| | | | 250/306 |
| 2003/0042434 | A1 | 3/2003 | Mankos et al. |
| 2005/0274911 | A1* | 12/2005 | Aloni ............... G03F 7/70275 |
| | | | 250/492.22 |
| 2009/0146085 | A1 | 6/2009 | Smirnov et al. |
| 2012/0138805 | A1* | 6/2012 | Missalla ............... G01J 1/4257 |
| | | | 250/362 |
| 2013/0335817 | A1* | 12/2013 | Isobe ................. G01N 23/2251 |
| | | | 359/363 |
| 2016/0011426 | A1* | 1/2016 | Mitra ................ G02B 27/0927 |
| | | | 359/623 |
| 2019/0198284 | A1* | 6/2019 | Matsunaga ............... H01J 1/30 |

OTHER PUBLICATIONS

RP Photonics Consulting GmbH, "Flat-top Beams," retrieved Oct. 2, 2018, found at https://www.rp-photonics.com/flat_top_beams.html.

* cited by examiner

ELECTRON BEAM GENERATION AND MEASUREMENT

CROSS-REFERENCE TO RELATED APPLICATIONS

This application claims priority to the provisional patent application filed Oct. 10, 2017 and assigned U.S. App. No. 62/570,438, the disclosure of which is hereby incorporated by reference.

FIELD OF THE DISCLOSURE

This disclosure relates to generation and measurement of electron beams.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Electron beams are commonly used for inspection and other purposes during semiconductor manufacturing. Emittance of an electron beam is commonly measured, especially for accelerator and lithography applications. The electron beam emittance can be used to determine how bright the electron beam is. Most emittance implementations image the spot at various distances from an electron beam source. For example, the spot may be imaged a distance from the electron beam source ranging from a few millimeters to more than 1 cm. Some of these implementations slice the electron beam and image it at a distance through a slit or a pepper pot. Others of these implementations infer emittance based on the focused image of the electron beam.

These previous emittance measurement techniques are based on imaging the spot size at a distance. This can include imaging the electron beam between long distances, which can cause problems or require complicated electron beam optics. Aberration and resolution difficulties are generally encountered using these long distances.

Therefore, improved systems and methods to generate and measure electron beams are needed.

BRIEF SUMMARY OF THE DISCLOSURE

A system is provided in a first embodiment. The system includes a laser source that generates a laser beam, a photocathode in a path of the laser beam, and an optical array disposed in the path of the laser beam between the laser source and the photocathode. The photocathode generates an electron beam upon illumination with the laser beam. The optical array is configured to provide a flat top profile to the laser beam.

The laser source can provide flood illumination. The photocathode can include an alkali halide.

The laser beam can have a uniform distribution over a surface of the photocathode.

In an instance, the system further includes a vacuum chamber in fluid communication with the photocathode, a phosphor screen disposed in the vacuum chamber in a path of the electron beam a non-zero distance from a surface of the photocathode, and a camera configured to image the phosphor screen. The phosphor screen includes phosphor powder. The camera may be disposed outside the vacuum chamber.

A wafer inspection system can include the system of the first embodiment.

A system is provided in a second embodiment. The system includes a laser source that generates a laser beam, an optical array in a path of the laser beam that is configured to split the laser beam into a plurality of beamlets, and a photocathode in a path of the beamlets. Each of the beamlets is configured to have a flat top profile. The photocathode generates electron beams upon illumination with the beamlets.

The laser source can provide flood illumination. The photocathode can include an alkali halide.

The beamlets can have a uniform distribution over a surface of the photocathode.

In an instance, the system further includes a vacuum chamber in fluid communication with the photocathode, a phosphor screen disposed in the vacuum chamber in a path of the electron beam a non-zero distance from a surface of the photocathode, and a camera configured to image the phosphor screen. The phosphor screen includes phosphor powder. The camera may be disposed outside the vacuum chamber.

A wafer inspection system can include the system of the second embodiment.

A method is provided in a third embodiment. The method includes directing a laser beam at a photocathode. The photocathode may include an alkali halide. The laser beam is converted to have a flat top profile using an optical array in a path of the laser beam. An electron beam is generated when the laser beam with the flat top profile illuminates the photocathode.

The laser beam can be generated with a laser source.

In an instance, the laser beam is split into a plurality of laser beams using the optical array. Each of the laser beams has the flat top profile.

In an instance, the electron beam is directed at a phosphor screen. The phosphor screen is imaged using a camera.

In an instance, the electron beam is directed at a semiconductor wafer. Electrons returned from a surface of the semiconductor wafer are detected.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

System and method embodiments disclosed herein can be used to measure the transverse electron energy at the extraction field where the most significant transverse energy spread effects typically happen. The measurements can include space charge effects. The near extraction field proximate the cathode surface can be used to maximize the resolution of the electron beam emittance measurement.

Figure 1:
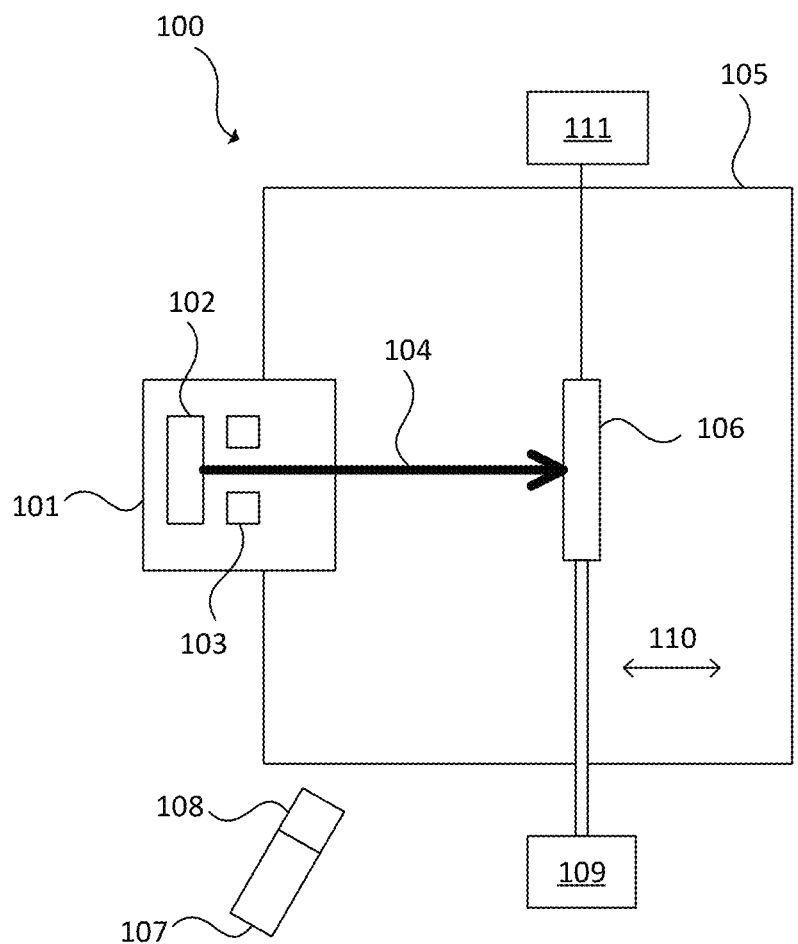
FIG. 1 is a block diagram of a system embodiment in accordance with the present disclosure.

FIG. 1 is a block diagram of a system 100. The system 100 includes an electron beam source 101 and a vacuum chamber 105. The electron beam source 101 may be in the vacuum chamber 105 or may be in fluid communication with the vacuum chamber 105.

The electron source 101 includes a cathode 102 and an extractor 103. The cathode 102 may be a thermal field emitter, a cold field emitter, or a photocathode. The cathode 102 also may be part of a camera or microchannel plate.

The electron source 101 generates at least one electron beam 104. The electron beam 104 may have specific electron beam properties, such as electron current density, angular current density, energy spread, or energy of the beam (KeV).

A phosphor screen 106 is disposed in the vacuum chamber 105 in a path of the electron beam 104. The phosphor screen 106 is positioned a non-zero distance from a surface of the cathode 102. For example, the distance may be on the scale of microns to millimeters. The distance can be proximate the emitter surface. This allows intrinsic and extrinsic factors of emission to be imaged.

The phosphor screen 106 can include phosphor powder. Low energy phosphors may be used. The phosphor powder may have an average size from 2 to 5 microns.

A camera 107 is configured to image the phosphor screen 106. The camera 107 may be positioned outside the vacuum chamber 105 or may be positioned on or in the vacuum chamber 105. The macrolens 108 may be configured to operate with the camera 107.

In an instance, the camera 107 includes a charge coupled device (CCD). The macrolens 108 with the camera 107 can project the image of the phosphor screen 106 to a CCD with a desired spatial resolution.

The camera 107 may be connected with a processor (not illustrated). The processor can be configured to determine electron energy or space charge effects of the electron beam 104 based on images from the camera 107.

A translation mechanism 109 can move the phosphor screen 106 in the vacuum chamber 105 relative to the surface of the cathode 102. For example, the phosphor screen 106 can be moved in the direction 110 using the translation mechanism 109, which can include an actuator. For example, the distance 110 may be on the scale of microns to millimeters.

The phosphor screen 106 also can be disposed on a stage configured to hold a wafer. The stage can act as an extractor or actuator that provides movement.

A voltage source 111 may be in electronic communication with the phosphor screen 106. The phosphor screen 106 can be biased. For example, the bias may be from a few hundred volts to a few kilovolts. The bias can help differentiate different mechanisms of emittance growth such as intrinsic emittance, Childs-Langmuir screening, or space charge.

While only one electron beam 104 is illustrated, multiple electron beams 104 can be produced using a single electron source 101 or multiple electron sources 101. The phosphor screen 106 can be disposed in the path of each of the electron beams 104 that is generated. In another embodiment, there is a single phosphor screen 106 for each of the electron beams 104 that is generated.

Figure 2:
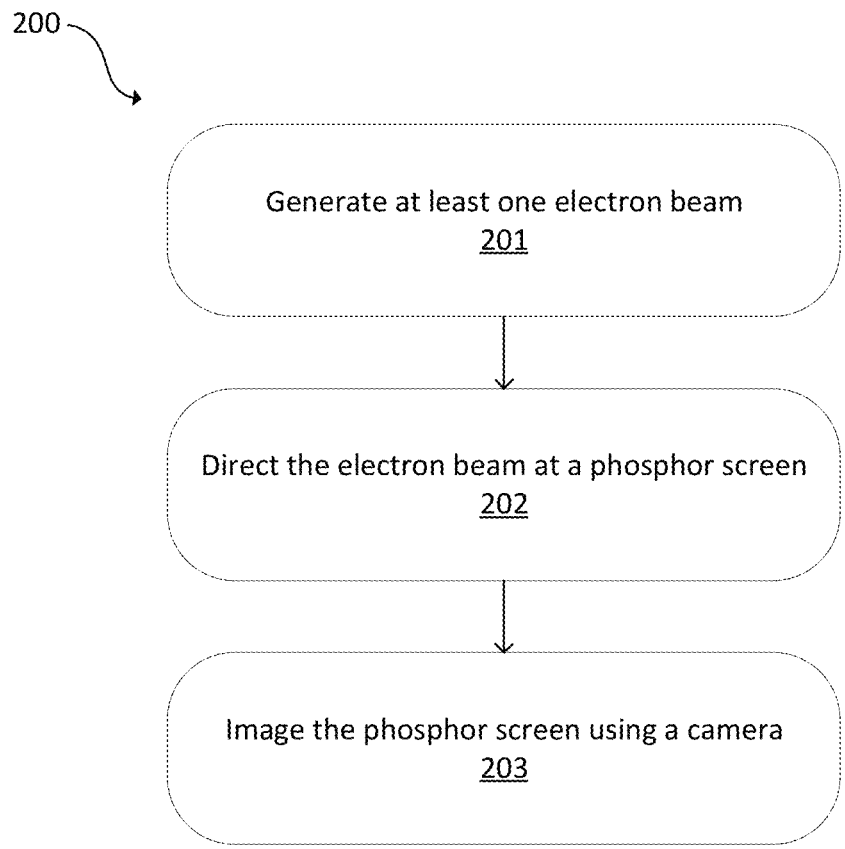
FIG. 2 is a flowchart showing an embodiment of a method in accordance with the present disclosure.

FIG. 2 is a flowchart showing a method 200. At least one electron beam is generated with an electron beam source at 201. At 202, the electron beam is directed at a phosphor screen. The phosphor screen is disposed a distance (z) from a surface of a cathode in the electron beam source. The phosphor screen may be biased.

The phosphor screen is imaged at 203 using a camera. For example, the phosphor screen can be imaged by a camera and macrolens outside the vacuum chamber. The resulting image can describe the spread of the spot.

Images of the phosphor screen using the camera can be used to determine, for example, electron energy or space charge effects of the electron beam. A processor can be used to determine these parameters. For example, transverse electron energy can be determined by the size of the image. In another example, varying the electron flux can help determining space charge effects.

The resolution of the resulting image may be affected by the camera or other components of the imaging system. If a powder phosphor is used in the phosphor screen, then the size of the phosphor powder also can affect the resolution of the resulting image. The grain size of the phosphor powder may be the minimum spot size that can be detected.

During imaging, voltage (V) to the cathode may be changed while the distance between the phosphor screen and the cathode surface is fixed. A variable extraction field can determine the transverse spread based on the resulting images.

During imaging, the distance between the phosphor screen and the cathode surface may be changed while voltage to the cathode is fixed. Changing the distance can help measure the transverse energy spread for a specific total electron energy.

Method 200 can use a regime where the extraction field and final electron beam energy are low. An electron beam with transverse energy $E_t$ will be diverse in space immediately after the cathode surface when the longitudinal velocity is low. The electron beam x(t) grows in the transverse direction based on the following equations.

$$x(t) = 2\left(\sqrt{\frac{E_t(\text{eV})d}{V}}\right)(\sqrt{z(t)})$$

$$\frac{dx}{dz} = \left(\sqrt{\frac{E_t(\text{eV})d}{V}}\right)z^{-1/2}$$

In the equations above, z is the longitudinal direction, V is the extraction voltage related to the electron energy, eV is electron volts, and d is the distance between the cathode and the extractor.

Figure 6:
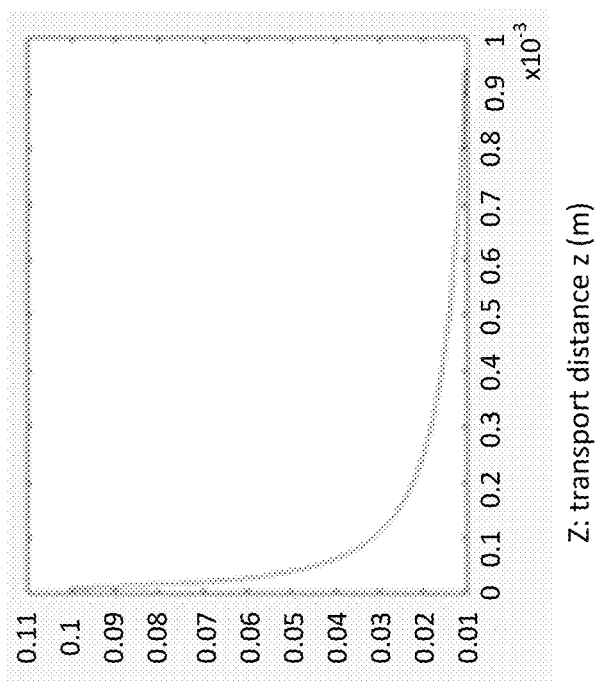
FIG. 6 is a graph showing change of transverse spot size as a function of transport distance of an electron beam.

As shown in FIG. 6, the spot size of the electron beam due to the transverse energy diverges the most when the longitudinal energy of the electron beam is low. In FIG. 6, the electron energy is 1 kV, the extraction voltage distance is 1 mm, and the transverse energy spread is 0.1 eV.

Figure 7:
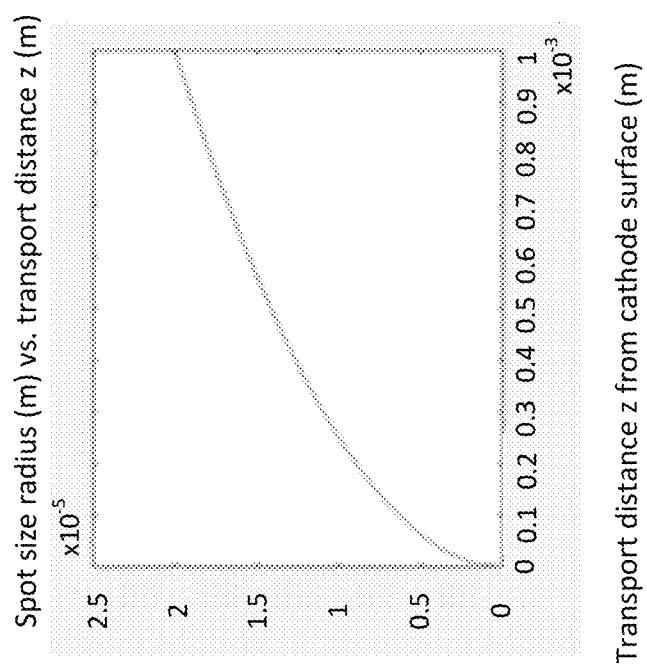
FIG. 7 is a graph showing spot size radius versus transport distance immediately after the cathode surface.

The spot size x(z) will grow for the same parameters as shown in FIG. 7.

Method 200 can be implemented by imaging the beam at a short distance from the planar cathode surface where the change in the spot size is maximum. This can reproduce FIG. 7 and measure the transverse energy spread and, thus, the normalized emittance.

The system 100 and method 200 can use the rapid increase of the spot size when the electrons are right after the cathode. Long distances or elaborate focusing schemes are not required to resolve the emittance.

The system 100 and method 200 can be used as an electron source in reticle and wafer inspection systems with single or multiple electron sources, reticle and wafer review systems with single or multiple electron sources, or reticle and wafer metrology systems with single or multiple electron sources. The system 100 and method 200 also can be used in systems that use electron sources with single or multiple electron beams for generation of x-rays that are used for wafer or reticle inspection, metrology, or review.

In an embodiment, an illumination scheme is used to provide a high brightness multiple electron beam source. Laser excitation has an effect on low emittance, high brightness photocathodes. Laser excitation can include both wavelength and beam profile.

Efforts to minimize the longitudinal and transverse energy spread (emittance) for high brightness high energy electron pulses can use of flat top laser pulses both in space and time. This can avoid the space charge and stability problems of semi-Gaussian laser beam profiles.

A flood, flat top illumination scheme for alkali halide photocathodes or photocathodes that include other materials that can drive a low emittance multi column continuous wave (CW) electron beam system can be used. For each individual beamlet, a flat top beam shape laser profile is applied either through flood illumination going through an optical array or by forming individual flat top laser beamlets.

A uniform illumination (flat top) creates less space charge and more current can be packed per unit area increasing the brightness without compromising the emittance. This also can provide longer photocathode lifetime, better electron stability, and lower noise in the electron beam because the same electrons can be extracted from a larger effective area with less chance of damaging the cathode due to better distributed power on the surface.

A flat top laser beam has an intensity profile which is flat over most of a covered area. For example, the amplitude variation across the covered area may be from 1% to 5%. This is unlike Gaussian beams in which intensity smoothly decays from its maximum on the beam axis to zero. Flat top laser beams can provide a constant intensity.

Figure 3:
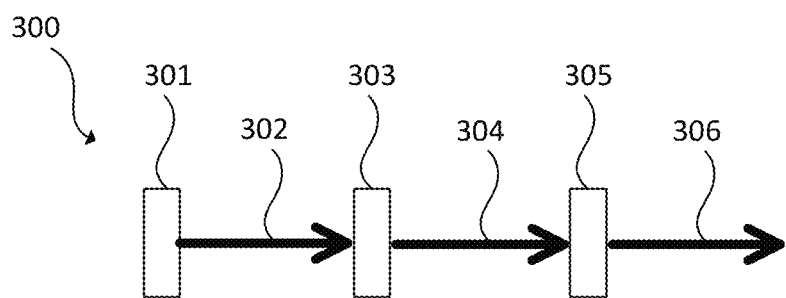
FIG. 3 is a block diagram of another system embodiment in accordance with the present disclosure.

FIG. 3 is a block diagram of a system 300. The system 300 includes a laser source 301 that generates a laser beam 302. The laser source 301 can provide flood illumination. Any laser source can be used, and the downstream optics can make the profile flat.

A photocathode 305 is positioned in a path of the laser beam 302. The photocathode 305 may include an alkali halide or other materials and can generate an electron beam 306 when illuminated by the laser beam 304.

An optical array 303 is disposed in the path of the laser beam 302 between the laser source 301 and the photocathode 305. The optical array 303 is configured to provide a flat top profile to the laser beam 302, which can result in the laser beam 304 with the flat top profile. The optical array 303 may operate as a mask.

The laser beam 304 with the flat top profile can have a uniform distribution over a surface of the photocathode 305.

The laser beam 302 can be split into multiple laser beams (e.g., beamlets). Each beamlet can have a flat top profile. The laser beam 302 can be split between the optical array 303 and the photocathode 305. Splitting the laser beam 302 prior to the optical array 303 may require multiple optical arrays 303.

Figure 4:
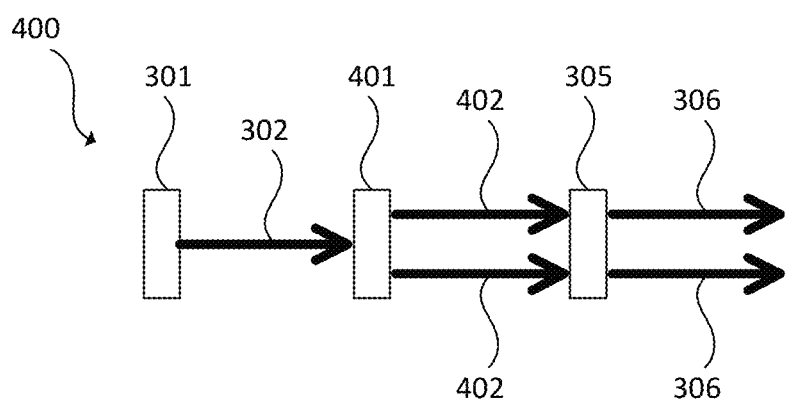
FIG. 4 is a block diagram of another system embodiment in accordance with the present disclosure.

FIG. 4 is a block diagram of a system 400. The system 300 includes a laser source 301 that generates a laser beam 302. The laser source 301 can provide flood illumination.

Optical array 401 is placed in a path of the laser beam 302. The optical array 401 split the laser beam 302 into beamlets 402. Each of the beamlets 402 is configured to have a flat top profile.

The optical array 303 or optical array 401 can include aspheric lenses or diffractive optics. Aspheric lenses can provide beam flatness (with low residual ripple) and a high power efficiency. In an instance, the optical array 303 or optical array 401 includes diffraction optical elements (DOE).

A photocathode 305 is positioned in a path of the laser beams 402. The photocathode 305 includes an alkali halide or other materials and can generate electron beams 306 when illuminated by the beamlets 402.

The beamlets 402 with the flat top profile can have a uniform distribution over a surface of the photocathode 305.

The system 300 or the system 400 can be used with the system 100.

Figure 5:
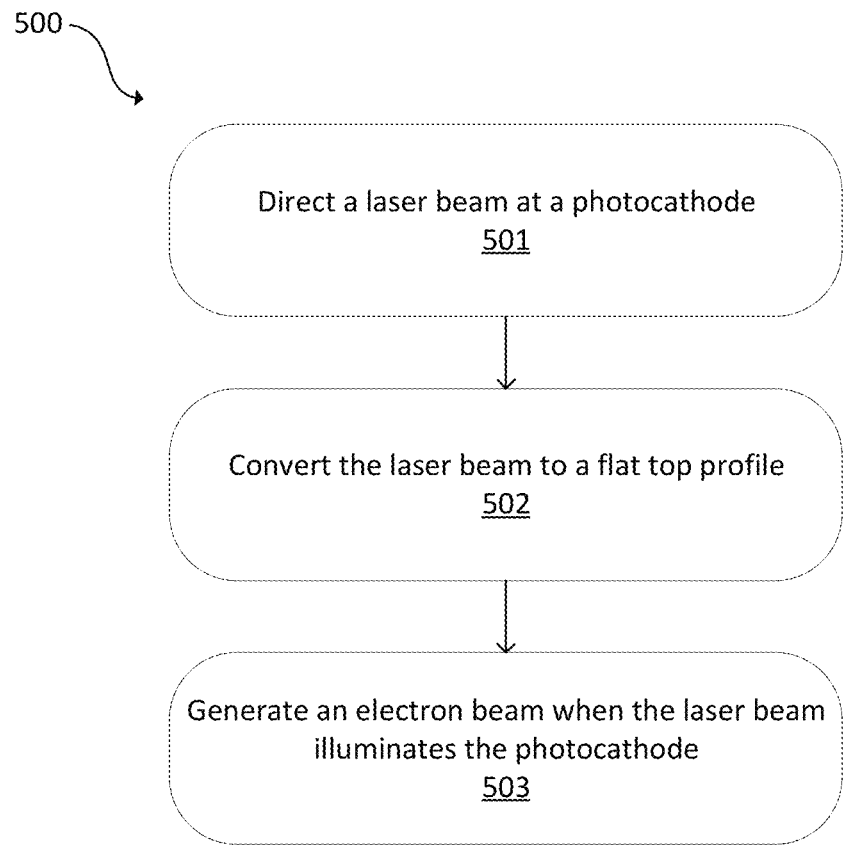
FIG. 5 is a flowchart showing another embodiment of a method in accordance with the present disclosure.

FIG. 5 is a flowchart showing a method 500. At 501, a laser beam is directed at a photocathode. The photocathode may include an alkali halide or other materials. The laser beam can be generated with a laser source. At 502, the laser beam is converted to a have a flat top profile. For example, a Gaussian profile may be converted to a flat top profile. At 503, an electron beam is generated when the laser beam with the flat top profile illuminates the photocathode.

The laser beam can be converted to have a flat top profile using an optical array in a path of the laser beam.

The method 500 can include multiple laser beams (i.e., beamlets). Thus, the method 500 can include splitting the laser beam in the multiple laser beams using the optical array. Each of the laser beams can have a flat top profile.

In an instance, the electron beam or beams is directed at a phosphor screen and the phosphor screen is imaged using a camera. Using a processor, electron energy or space charge effects of the electron beam can be determined from images of the phosphor screen.

Variations of this embodiment can be used as an electron source in reticle and wafer inspection systems with single or multiple electron sources, reticle and wafer review systems with single or multiple electron sources, or reticle and wafer metrology systems with single or multiple electron sources. Variations of this embodiment also can be used in systems that use electron sources with single or multiple electron beams for generation of x-rays that are used for wafer or reticle inspection, metrology, or review.

In another embodiment, emitted photocurrent can be continuously measured or otherwise monitored using a biased substrate while growing the photocathode film under illumination with a wavelength of specific interest. The biased substrate can be used to monitor the induced photocurrent during deposition of the photocathode under illumination with a wavelength of interest. This can enable thickness optimization for maximum absorption of specific wavelength and identification of substrate/photocathode thin film traps. Previous techniques did not have a continuous monitoring method of photocurrent during deposition and did not monitor for interface traps. Heat load management and lifetime optimization can be provided by adjusting the thickness of the photocathode for a specific wavelength and heat load. Deposition parameters can be optimized for maximum quantum efficiency (QE).

Under light illumination of the photocathode in transmission mode, the desired thickness of the photocathode may need to be adjusted to the illumination wavelength for maximum absorption and maximum QE. The amount of power absorbed per photocathode thickness can be determined by Beer-Lambert's law.

$$P_{out} = P_{in} \exp[-a(\lambda)x]$$

In the equation above, $P_{out}$ is the optical power leaving the material without being absorbed, $P_{in}$ is the input power to the photocathode, $a(\lambda)$ is the absorption coefficient of the photocathode material that strongly depends on wavelength, and x is the thickness of the photocathode film.

Longer wavelengths can require thicker films to be absorbed. For example, approximately 1 micron may be needed for visible and near infrared. Ultraviolet and deep ultraviolet wavelengths may be absorbed within a few nanometers of the substrate/photocathode interface.

In the latter case, there is loss of photogenerated electrons due to traps activated near the substrate/photocathode interface and loss of electrons due to scattering in the photocathode body during travel towards the emitting surface. Both of these loss factors contribute to heat generation, degradation of the photocathode lifetime, and loss of quantum efficiency.

By monitoring the current emitted during growth, it is possible to optimize for thickness for a specific wavelength. This also can optimize heat load on the cathode. Deposition parameters can be adjusted to provide an optimized recipe for photocathode deposition. Growth can be stopped when a collected photocurrent is at a maximum.

Photocathode thin films are not typically grown while monitoring the emitted current during deposition. There are usually thickness monitoring methods such as quartz crystal microbalance (QCM) and the deposition recipe is determined by prior thickness optimization assessment. There are current monitoring techniques developed for negative electron affinity (NEA) photocathodes that require capping with Cs, Cs/O, or $Cs/NF_3$ layers but these are layers that provide the negative electron affinity on the photocathode surface and not the photoabsorption mechanism. Thus, these techniques do not determine the photons absorbed by the photocathode.

This embodiment can include optics for shaping the laser beam profile having a uniform distribution over a large area of the photocathode. This embodiment also can include a mask to distribute the light to individual beamlets with uniform distribution.

A positively biased metallic contact at the interface of the photocathode/substrate that is transparent to the wavelengths of interest, such as ruthenium, can be used for the cathode to operate in transmission mode.

Thus, this embodiment can provide a QE performance monitor of the photocathode during deposition and a continuous monitor of thickness and heat load optimization of the photocathode during deposition. The electron beam source can be optimized for reticle and wafer inspection systems or for other applications. For example, the emitters can be optimized for QE, heat control, and lifetime to be used in particular applications. Variations of this embodiment can be used as an electron source in reticle and wafer inspection systems with single or multiple electron sources, reticle and wafer review systems with single or multiple electron sources, or reticle and wafer metrology systems with single or multiple electron sources. Variations of this embodiment also can be used in systems that use electron sources with single or multiple electron beams for generation of x-rays that are used for wafer or reticle inspection, metrology, or review.

Figure 8:
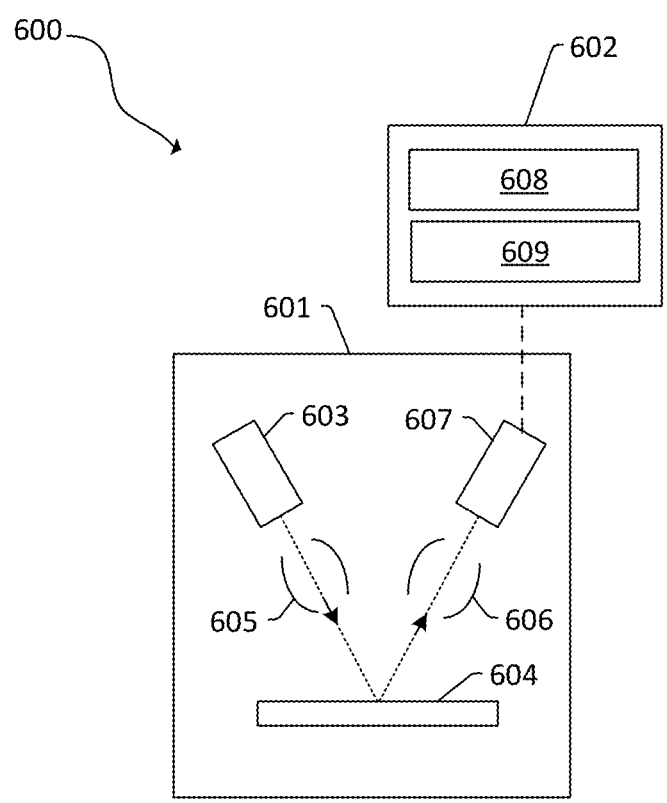
FIG. 8 is a block diagram of an embodiment of a system in accordance with the present disclosure.

FIG. 8 is a block diagram of an embodiment of a system 600. The system 600 includes a wafer inspection system (which includes the electron column 601) configured to generate images of a wafer 604.

The wafer inspection system includes an output acquisition subsystem that includes at least an energy source and a detector. The output acquisition subsystem may be an electron beam-based output acquisition subsystem. For example, in one embodiment, the energy directed to the wafer 604 includes electrons, and the energy detected from the wafer 604 includes electrons. In this manner, the energy source may be an electron beam source. In one such embodiment shown in FIG. 8, the output acquisition subsystem includes electron column 601, which is coupled to computer subsystem 602. A chuck (not illustrated) may hold the wafer 604.

The system 600 can include the system 100 or other embodiments disclosed herein.

As also shown in FIG. 8, the electron column 601 includes an electron beam source 603 configured to generate electrons that are focused to wafer 604 by one or more elements 605. The one or more elements 605 may include, for example, a gun lens, an anode, a beam limiting aperture, a gate valve, a beam current selection aperture, an objective lens, and a scanning subsystem, all of which may include any such suitable elements known in the art. The electron beam source and/or elements 605 can include embodiments of the system 300 or the system 400.

Electrons returned from the wafer 604 (e.g., secondary electrons) may be focused by one or more elements 606 to detector 607. One or more elements 606 may include, for example, a scanning subsystem, which may be the same scanning subsystem included in element(s) 605.

The electron column also may include any other suitable elements known in the art, including the system 100.

Although the electron column 601 is shown in FIG. 8 as being configured such that the electrons are directed to the wafer 604 at an oblique angle of incidence and are scattered from the wafer 604 at another oblique angle, the electron beam may be directed to and scattered from the wafer 604 at any suitable angles. In addition, the electron beam-based output acquisition subsystem may be configured to use multiple modes to generate images of the wafer 604 (e.g., with different illumination angles, collection angles, etc.). The multiple modes of the electron beam-based output acquisition subsystem may be different in any image generation parameters of the output acquisition subsystem.

Computer subsystem 602 may be coupled to detector 607 such that the computer subsystem 602 is in electronic communication with the detector 607 or other components of the wafer inspection system. The detector 607 may detect electrons returned from the surface of the wafer 604 thereby forming electron beam images of the wafer 604 with the computer subsystem 602. The electron beam images may include any suitable electron beam images. The computer subsystem 602 includes a processor 608 and an electronic data storage unit 609. The processor 608 may include a microprocessor, a microcontroller, or other devices.

It is noted that FIG. 8 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The computer subsystem 602 may be coupled to the components of the system 600 or system 100 (e.g., the camera 107) in any suitable manner (e.g., via one or more transmission media, which may include wired and/or wireless transmission media) such that the processor 608 can receive output. The processor 608 may be configured to perform a number of functions using the output. The wafer inspection system can receive instructions or other information from the processor 608. The processor 608 and/or the electronic data storage unit 609 optionally may be in electronic communication with another wafer inspection system, a wafer metrology tool, or a wafer review tool (not illustrated) to receive additional information or send instructions.

The computer subsystem 602, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 608 and electronic data storage unit 609 may be disposed in or otherwise part of the system 600 or another device. In an example, the processor 608 and electronic data storage unit 609 may be part of a standalone control unit or in a centralized quality control unit. Multiple processors 608 or electronic data storage unit 609 may be used.

The processor 608 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 608 to implement various methods and functions may be stored in readable storage media, such as a memory in the electronic data storage unit 609 or other memory.

The system 600 of FIG. 8 is merely one example of a system that can use the system 100. Embodiments of the system 100 may be part of a defect review system, an inspection system, a metrology system, or some other type of system. Thus, the embodiments disclosed herein describe some configurations that can be tailored in a number of manners for systems having different capabilities that are more or less suitable for different applications.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a laser source that generates a laser beam;
   a photocathode in a path of the laser beam, wherein the photocathode generates an electron beam upon illumination with the laser beam;
   an optical array disposed in the path of the laser beam between the laser source and the photocathode, wherein the optical array is configured to provide a flat top profile to the laser beam;
   a vacuum chamber in fluid communication with the photocathode;
   a phosphor screen disposed in the vacuum chamber in a path of the electron beam a non-zero distance from a surface of the photocathode, wherein the phosphor screen includes phosphor powder;
   a translation mechanism configured to move the phosphor screen in the vacuum chamber relative to a surface of the photocathode;
   a camera configured to image the phosphor screen; and
   a processor configured to determine electron energy and/or space charge effects of the electron beam using an image from the camera.

2. The system of claim 1, wherein the laser source provides flood illumination.

3. The system of claim 1, wherein the laser beam has a uniform distribution over a surface of the photocathode.

4. The system of claim 1, wherein the camera is disposed outside the vacuum chamber.

5. The system of claim 1, wherein the photocathode includes an alkali halide.

6. A wafer inspection system including the system of claim 1.

7. A system comprising:
a laser source that generates a laser beam;
an optical array in a path of the laser beam that is configured to split the laser beam into a plurality of beamlets, wherein each of the beamlets is configured to have a flat top profile;
a photocathode in a path of the beamlets, wherein the photocathode generates electron beams upon illumination with the beamlets;
a vacuum chamber in fluid communication with the photocathode;
a phosphor screen disposed in the vacuum chamber in a path of at least one of the electron beams a non-zero distance from a surface of the photocathode, wherein the phosphor screen includes phosphor powder;
a translation mechanism configured to move the phosphor screen in the vacuum chamber relative to a surface of the photocathode;
a camera configured to image the phosphor screen; and
a processor configured to determine electron energy and/or space charge effects of the electron beam using an image from the camera.

8. The system of claim 7, wherein the laser source provides flood illumination.

9. The system of claim 7, wherein the beamlets have a uniform distribution over a surface of the photocathode.

10. The system of claim 7, wherein the photocathode includes an alkali halide.

11. The system of claim 7, wherein the camera is disposed outside the vacuum chamber.

12. A wafer inspection system including the system of claim 7.

13. A method comprising:
directing a laser beam at a photocathode;
converting the laser beam to have a flat top profile using an optical array in a path of the laser beam;
generating an electron beam when the laser beam with the flat top profile illuminates the photocathode;
translating a phosphor screen relative to the photocathode;
directing the electron beam at the phosphor screen;
imaging the phosphor screen using a camera; and
determining, using a processor, electron energy and/or space charge effects of the electron beam using an image from the camera.

14. The method of claim 13, further comprising generating the laser beam with a laser source.

15. The method of claim 13, wherein the photocathode includes an alkali halide.

16. The method of claim 13, further comprising splitting the laser beam into a plurality of laser beams using the optical array, wherein each of the laser beams has the flat top profile.

17. The method of claim 13, further comprising:
translating the phosphor screen out of a path of the electron beam;
directing the electron beam at a semiconductor wafer; and
detecting electrons returned from a surface of the semiconductor wafer.

* * * * *